United States Patent
Li et al.

(10) Patent No.: US 9,337,126 B2
(45) Date of Patent: May 10, 2016

(54) INTEGRATED CIRCUIT AND FABRICATING METHOD THEREOF

(71) Applicant: Taiwan Semiconductor Manufacturing CO., LTD., Hsinchu (TW)

(72) Inventors: Chen-Hao Li, Kaohsiung (TW); Ying-Han Chiou, Tainan (TW); Chi-Yen Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 167 days.

(21) Appl. No.: 14/091,610

(22) Filed: Nov. 27, 2013

(65) Prior Publication Data

US 2015/0145119 A1 May 28, 2015

(51) Int. Cl.
*H01L 23/48* (2006.01)
*H01L 21/768* (2006.01)
*H01L 23/00* (2006.01)

(52) U.S. Cl.
CPC ........ *H01L 23/481* (2013.01); *H01L 21/76838* (2013.01); *H01L 24/03* (2013.01); *H01L 24/05* (2013.01); *H01L 24/13* (2013.01); *H01L 24/16* (2013.01); *H01L 24/81* (2013.01); *H01L 2224/0345* (2013.01); *H01L 2224/03452* (2013.01); *H01L 2224/03462* (2013.01); *H01L 2224/0401* (2013.01); *H01L 2224/0557* (2013.01); *H01L 2224/05624* (2013.01); *H01L 2224/05647* (2013.01); *H01L 2224/05684* (2013.01); *H01L 2224/13022* (2013.01); *H01L 2224/13025* (2013.01); *H01L 2224/16235* (2013.01); *H01L 2224/16238* (2013.01); *H01L 2224/81193* (2013.01); *H01L 2924/157* (2013.01); *H01L 2924/15311* (2013.01); *H01L 2924/37001* (2013.01)

(58) Field of Classification Search
CPC . H01L 23/481; H01L 21/76897; H01L 24/17; H01L 24/81
See application file for complete search history.

(56) References Cited

U.S. PATENT DOCUMENTS

2010/0032764 A1* 2/2010 Andry ............... H01L 21/76898 257/369

* cited by examiner

*Primary Examiner* — David Vu (57) ABSTRACT

An integrated circuit and a method of fabricating the integrated circuit are provided. In various embodiments, the integrated circuit includes a first substrate, a second substrate, and a bump pad. The first substrate has at least one active device and a plurality of first metallic pads electrically connected to the active device. The first substrate has front-end-of-line processing layers without back-end-of-line processing layers over the front-end-of-line processing layers. The second substrate has a semiconductor substrate and an interconnect structure disposed on the semiconductor substrate, and the interconnect structure has at least one second metallic pad. The second substrate does not include any active devices. The bump pad is sandwiched by the first substrate and the second substrate. The active device and the first metallic pad of the first substrate are electrically connected to the second metallic pad of the second substrate through the bump pad.

20 Claims, 9 Drawing Sheets

INTEGRATED CIRCUIT AND FABRICATING METHOD THEREOF

BACKGROUND

Manufacturing of an integrated circuit has been largely driven by the need to increase the density of the integrated circuit formed in a semiconductor device. This is typically accomplished by implementing more aggressive design rules to allow larger density of the integrated circuit to be formed. With the significant size shrinkage of the semiconductor devices, the area to form the integrated circuit is dramatically reduced. It results in even more aggressive processes for manufacturing of the integrated circuit to maximize the density of the integrated circuit. Therefore, more interconnect layers of the integrated circuit are needed to be formed to satisfy the miniaturization of manufacturing the integrated circuit.

In fabricating the interconnect layers, which are fabricated during back-end-of-line (BEOL) processes, of the integrated circuit, any defects or particles can render failure of an active device, which is fabricated during front-end-of-line processes (FEOL). Unfortunately, these interconnect defects or particles occurred during the BEOL processes are discovered only after the completeness of costly and time-consuming steps of FEOL processes.

As the density of the integrated circuit increasing and more interconnect layers of the integrated circuit to be formed, the probability of defects or hazardous particles occurred during back-end-of-line processes also increase. Therefore, the yield of manufacturing the integrated circuit in the semiconductor device decreases. Accordingly, improvements in integrated circuits and methods thereof continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a liner layer includes embodiments having two or more such liner layers, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Conventional approach of fabricating an integrated circuit with an active device and a multi-layer interconnect structure is a bottom-up process. Fabrication of front-end-of-line processing layers (including the active device) and that of back-end-of-line process layers (including the multi-layer interconnect structure) are performed in series. Therefore, the cycle time of fabricating the integrated circuit with the active device and the multi-layer interconnect structure is relatively long. In addition, particles contamination and/or process defects may occur within each layer of back-end-of-line processing layers and front-end-of-line process layers. It results in lower yield in fabricating the integrated circuit. In this regard, integrated circuits and methods of fabricating the integrated circuits are provided according to various embodiments of the present disclosure.

Figure 1:
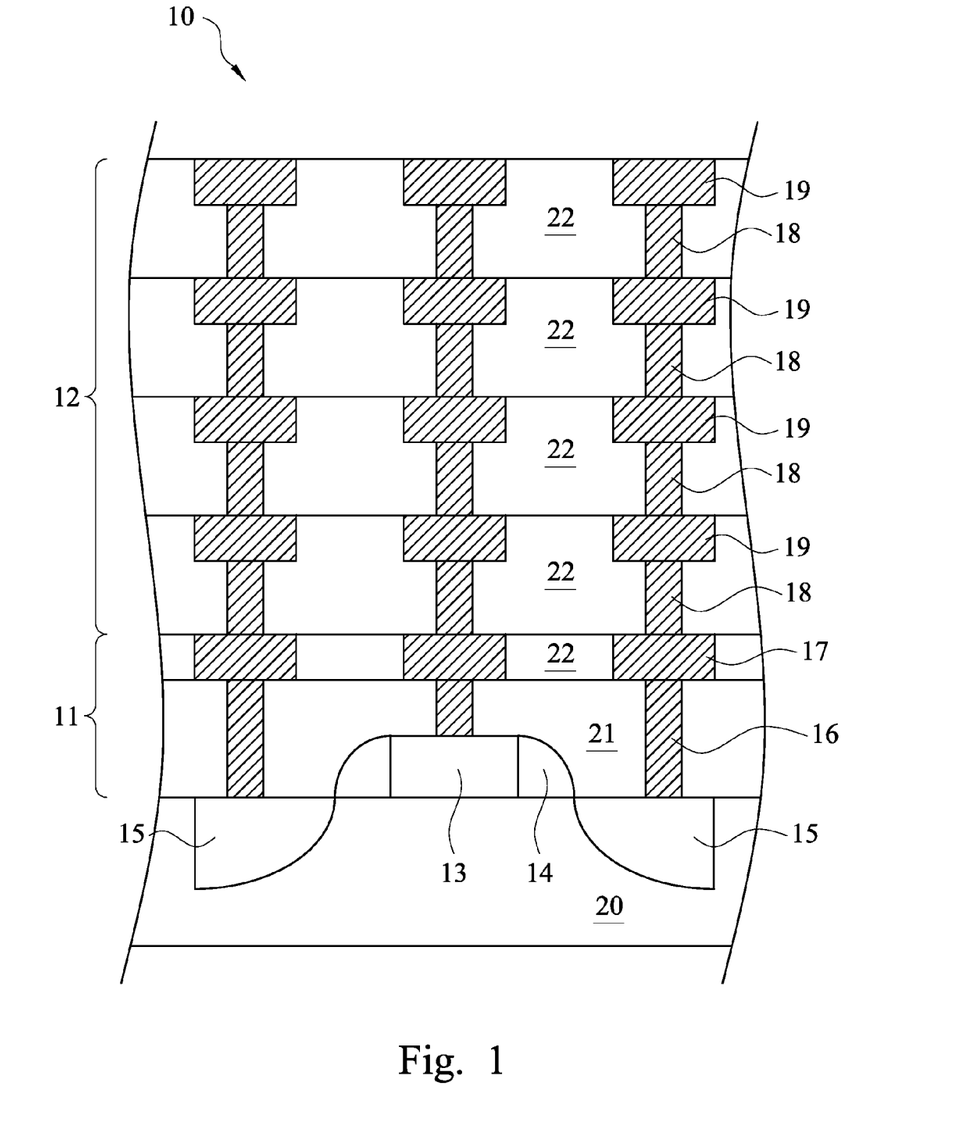
FIG. 1 is a schematic cross-sectional view illustrating a conventional integrated circuit with a multi-layer interconnect structure.

FIG. 1 is a schematic cross-sectional view illustrating a conventional integrated circuit with a multi-layer interconnect structure. As illustrated in FIG. 1, the multi-layer interconnect structure of the conventional integrated circuit 10 is fabricated by two sequential groups of processing layers including front-end-of-line process layers 11 and back-end-of-line processing layers 12. The front-end-of-line process layers 11 include an active device (including gate electrode 13, spacers 14, and source/drain electrodes 15) formed on a semiconductor substrate 20, a pre-metal dielectric layer 21 formed on the active device, a first metallic layer having a plurality of first metallic pads 17 formed on the pre-metal dielectric layer 21, and a plurality of contacts 16 formed in the pre-metal dielectric layer 21 to electrically connect the active device and the plurality of first metallic pads 17. The contacts 16 are respectively electrically connected to the gate electrode 13 and the source/drain electrodes 15 of the active device. The back-end-of-line processing layers 12 include an interconnect structure having different layers of metallic layers, inter-metal dielectric layers 22 between different layers of metallic layers, and a plurality of vias 18 disposed in the inter-metal dielectric layers 22. Each layer of the metallic layers having a plurality of second metallic pads 19, and the plurality of vias 18 disposed in the inter-metal dielectric layers 22 electrically connects the second metallic pads 19 on different metallic layers, or the second metallic pads 19 and the first metallic pads 17 as illustrated in FIG. 1. Conventionally, fabrication of back-end-of-line processing layers 12 is performed after that of front-end-of-line process layers 11. That is, a bottom-up sequence of processes is performed on one semiconductor substrate 20 to fabricate the multi-layer interconnect structure of the conventional integrated circuit 10. However, since fabrication of back-end-of-line processing layers 12 and that of front-end-of-line process layers 11 are performed in series, the cycle time of fabricating front-end-of-line process layers 11 and back-end-of-line processing layers 12 is summed up to be a relatively long the cycle time of fabricating the multi-layer interconnect structure of the integrated circuit. In addition, particles contamination and/or process defects may occur within each layer of back-end-of-line processing layers 12 and front-end-of-line process layers 11. These issues leads lower yields of the multi-layer interconnect structure of the integrated circuit within a semiconductor wafer.

Figure 2:
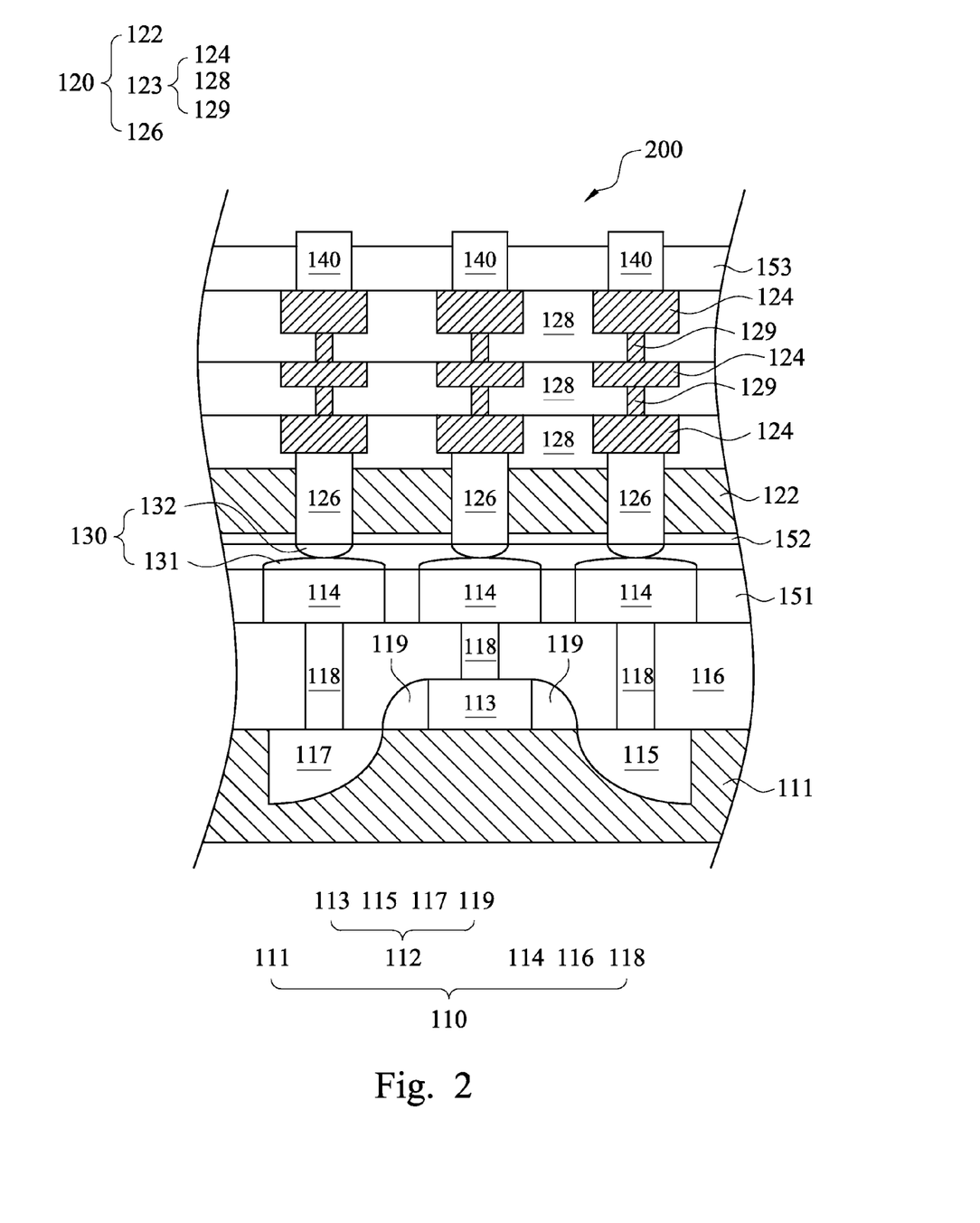
FIG. 2 is a schematic cross-sectional view illustrating an integrated circuit according to various embodiments of the present disclosure.

FIG. 2 is a schematic cross-sectional view illustrating an integrated circuit 200 according to various embodiments of the present disclosure. As illustrated in FIG. 2, the integrated circuit 200 includes a first substrate 110, a second substrate 120, and a plurality of bump pads 130. The first substrate 110 has at least one active device 112 and a plurality of first metallic pads 114 electrically connected to the active device 112. The active device 112 and the plurality of first metallic pads 114 are, for example, fabricated on a semiconductor substrate 111. The semiconductor substrate 111 may be can be a silicon substrate, a III-V compound substrate, a silicon/germanium (SiGe) substrate, a silicon-on-insulator (SOI) substrate. In various embodiments of the present disclosure, the active device 112 includes a gate electrode 113, a source electrode 115, and a drain electrode 117. The active device 112 may further include spacers 119 respectively disposed along two sides of the gate electrode 113. Also shown in FIG. 1, in various embodiments of the present disclosure, the first substrate 110 further includes an inter-layer dielectric 116 and a plurality of contacts 118. The inter-layer dielectric 116 is disposed between the active device 110 and the plurality of first metallic pads 114. The plurality of contacts 118 is disposed in the inter-layer dielectric 116. The contacts 118 are respectively electrically connected to the gate electrode 113, the source electrode 115, and the drain electrode 117 of the active device 112. The inter-layer dielectric 116 may be silicon dioxide, silicon nitride, or a combination thereof. The contacts 118 and the plurality of first metallic pads 114 may be aluminum (Al), tungsten (W), copper (Cu), or other suitable metal material deposited by CVD, PVD, electrochemical plating (ECP), or other suitable process. As shown in FIG. 2, a passivation film 151 may be further formed to protect the plurality of first metallic pads 114 from damage or oxidation. It should be noticed that the first substrate 110 only has front-end-of-line processing layers (as aforementioned in FIG. 1), and the first substrate 110 does not include back-end-of-line processing layers (as aforementioned in FIG. 1) over the front-end-of-line processing layers.

Referring to FIG. 2, the second substrate 120 has a semiconductor substrate 122 and an interconnect structure 123 disposed on the semiconductor substrate 122. The semiconductor substrate 122 may be can be a silicon substrate, a III-V compound substrate, a silicon/germanium (SiGe) substrate, a silicon-on-insulator (SOI) substrate. The interconnect structure 123 has a plurality of second metallic pads. As illustrated in FIG. 2, the interconnect structure 123 may include several layers of metallic layers, inter-metal dielectric layers 128 between different layers of metallic layers, and a plurality of vias 129 disposed in the inter-metal dielectric layers 128. Each metallic layer has at least one second metallic pad 124, and the vias 129 disposed in the inter-metal dielectric layers 128 electrically connect the second metallic pads 124 on different layers. The second metallic pads 124 and the vias 129 may be aluminum (Al), tungsten (W), copper (Cu), or other suitable metal material deposited by CVD, PVD, electrochemical plating (ECP), or other suitable process. The inter-metal dielectric layers 128 may be silicon dioxide, or a low-k dielectric material or a ultra low k material, such as borophosphosilicate glass (BPSG), borosilicate glass (BSG), phosphosilicate glass (PSG), fluorinated silica glass (FSG), SiLK, BLACK DIAMOND, and the like. It should be noticed that the second substrate 120 does not include any active devices. In various embodiments of the present disclosure, the second substrate 120 further includes a plurality of through-silicon vias 126 disposed in the semiconductor substrate 122, and the through-silicon vias 126 are respectively electrically connected to the second metallic pads 124. The through-silicon vias 126 may be aluminum (Al), tungsten (W), copper (Cu), or other suitable metal material for fabricating through-silicon vias. As shown in FIG. 2, passivation films 152, 153 may be further formed to respectively protect the plurality of through-silicon vias 126 and the plurality of first metallic pads 114 from damage or oxidation. The plurality of bump pads 130 is sandwiched by the first substrate 110 and the second substrate 120. As shown in FIG. 2, the bump pad 130 may include a first bump pad 131 disposed on the first metallic pad 114 of the first substrate 110, and a second bump pad 131 disposed below the through-silicon vias 126 of the second substrate 120. In various embodiments of the present disclosure, the bump pad 130 is sandwiched by the first metallic pad 114 and the through-silicon via 126. As illustrated in FIG. 2, in various embodiments of the present disclosure, the semiconductor substrate 120 is disposed between the bump pads 130 and the second metallic pads 124, and the second metallic pads 124 are respectively electrically connected to the bump pads 130 through the through-silicon vias 126. Therefore, the active device 112 and the first metallic pads 114 of the first substrate 110 are electrically connected to the second metallic pads 114 of the second substrate 120 through the bump pad 130. Also shown in FIG. 2, in various embodiments of the present disclosure, the integrated circuit 200 further includes a plurality of bonding pads 140 disposed on the plurality of second metallic pads 124 of the second substrate 120. The bonding pads 140 are respectively electrically connected to the second metallic pads 120.

Figure 3:
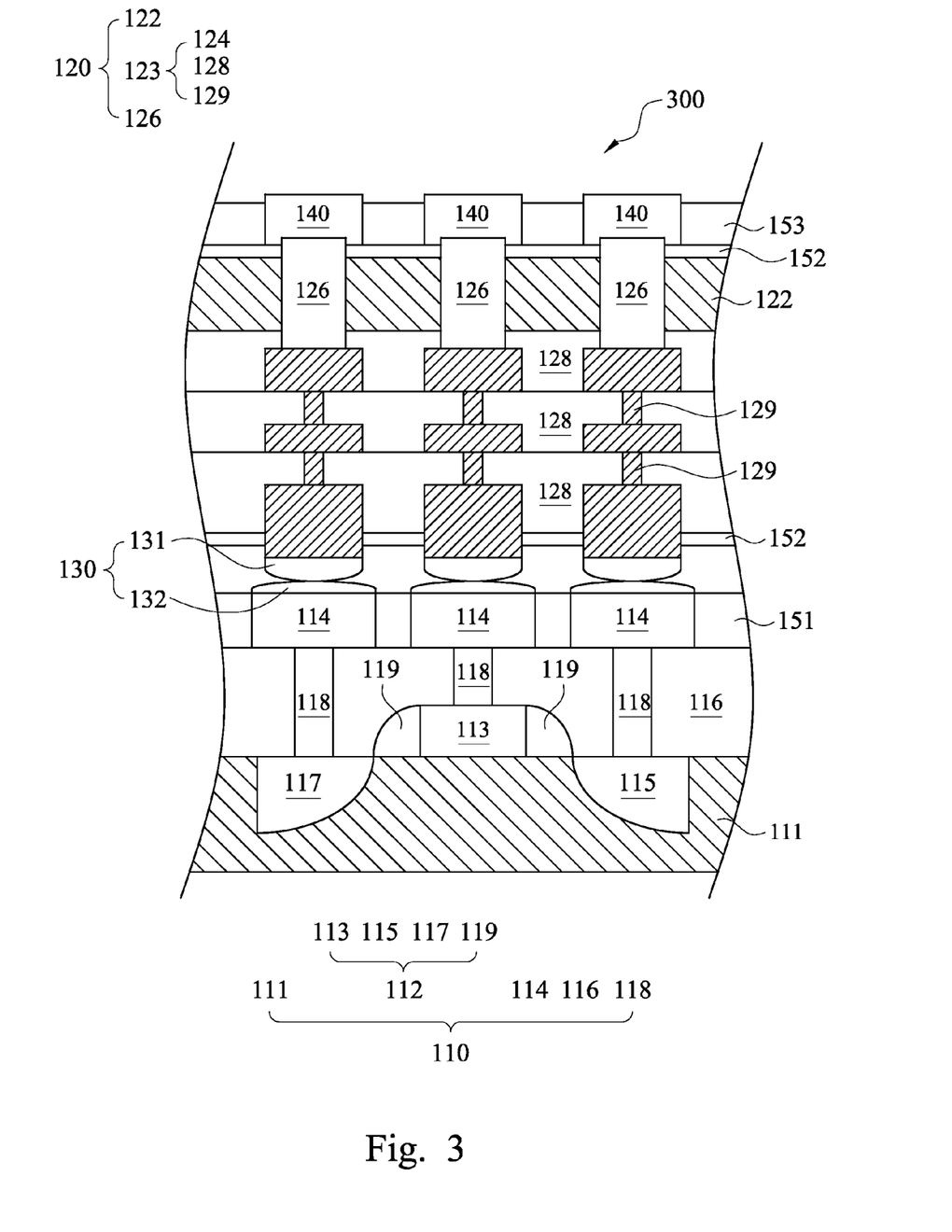
FIG. 3 is a schematic cross-sectional view illustrating an integrated circuit according to various embodiments of the present disclosure.

FIG. 3 is a schematic cross-sectional view illustrating an integrated circuit 300 according to other various embodiments of the present disclosure. As illustrated in FIG. 3, the integrated circuit 300 includes the first substrate 110, the second substrate 120, and the bump pad 130. The compositions of each aforementioned element (the first substrate 110, the second substrate 120, and the bump pad 130) are similar to those described in FIG. 2, and therefore the details are omitted here. The differences between the integrated circuit 300 illustrated in FIG. 3 and the integrated circuit 200 in FIG. 2 is that the second metallic pads 124 are disposed between the bump pads 130 and the semiconductor substrate 122, and the through-silicon vias 126 of the second substrate 120 are respectively electrically connected to the bump pad 130 through the second metallic pads 124. As illustrated in FIG. 3, in various embodiments of the present disclosure, the second metallic pad 124 is disposed between the bump pad 130 and the semiconductor substrate 122, and the through-silicon vias 126 of the second substrate 120 is electrically connected to the bump pad 130 through the second metallic pad 124. Also shown in FIG. 3, in various embodiments of the present disclosure, the bump pad 130 is sandwiched by the first metallic pad 114 and the second metallic pad 124. Therefore, the active device 112 and the first metallic pads 114 of the first substrate 110 are also electrically connected to the second metallic pads 114 of the second substrate 120 through the bump pads 130. Also shown in FIG. 3, in various embodiments of the present disclosure, the integrated circuit 300 further includes a plurality of bonding pads 140 disposed on the through-silicon vias 126 of the second substrate 120. The bonding pads 140 are respectively electrically connected to the second metallic pads 124 through the through-silicon vias 126. As illustrated in FIG. 3, it should be noticed that the semiconductor substrate 122 is positioned above the second metallic pads 114 and the first substrate 110, therefore better mechanical strength can be offered by the semiconductor substrate 122 during the operation of forming the plurality of bonding pads 140. Accordingly, the process stability of the operation of forming the plurality of bonding pads 140 is improved, and furthermore the yield of the integrated circuit 300 would be greater than that of previous integrated circuit 200.

Figure 4:
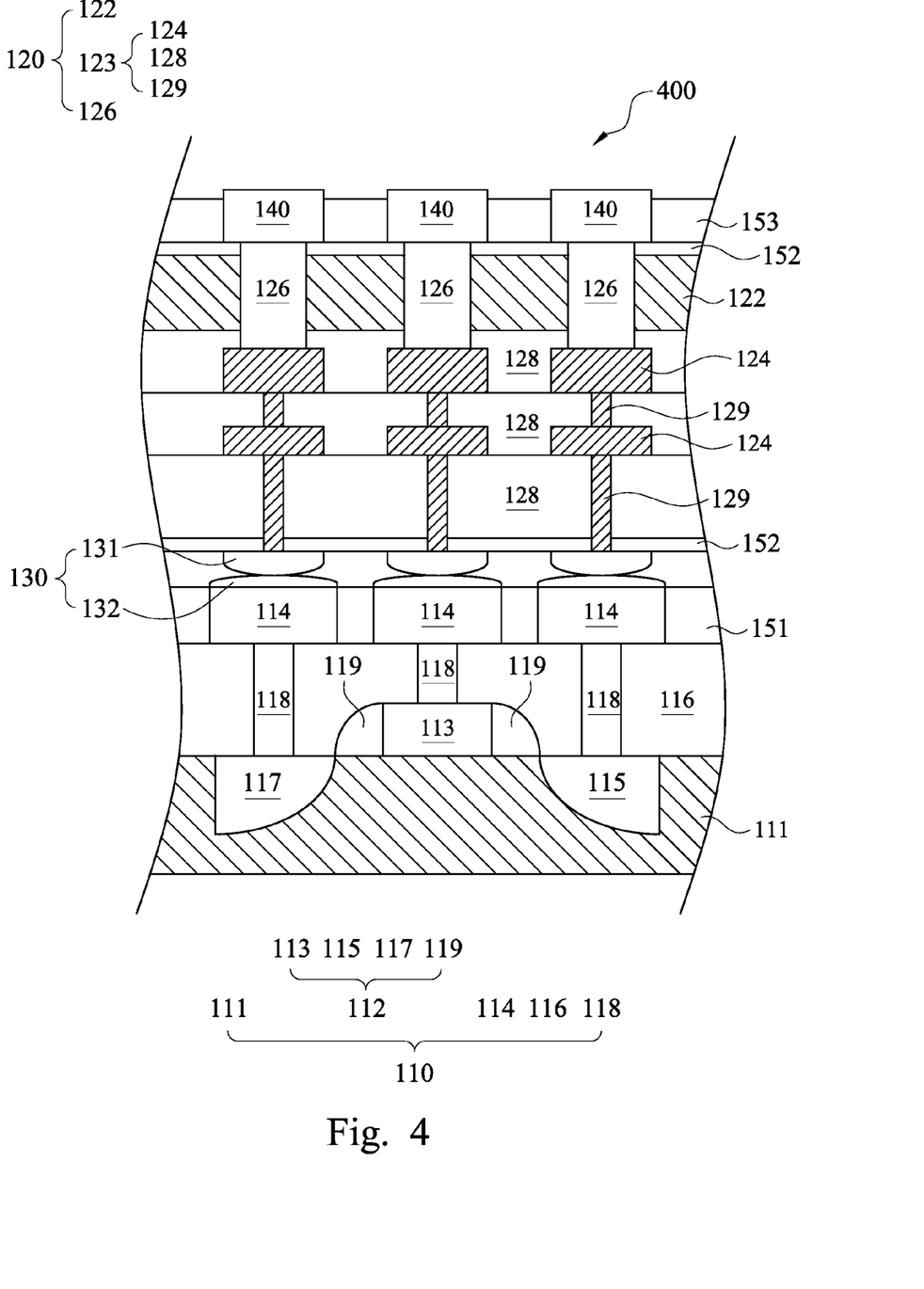
FIG. 4 is a schematic cross-sectional view illustrating an integrated circuit according to various embodiments of the present disclosure.

FIG. 4 is a schematic cross-sectional view illustrating an integrated circuit according to various embodiments of the present disclosure. As illustrated in FIG. 4, the integrated circuit 400 includes the first substrate 110, the second substrate 120, and the bump pad 130. The compositions of each aforementioned element (the first substrate 110, the second substrate 120, and the bump pad 130) are similar to those described in FIG. 3, and therefore the details are omitted here. The interconnect structure 123 further includes an inter-metal layer 128 covering the second metallic pads 124, and a plurality of vias 129 disposed in the inter-metal layer 128. The vias 129 are electrically connected to the second metallic pads 124. The differences between the integrated circuit 400 illustrated in FIG. 4 and the integrated circuit 300 in FIG. 3 is that the bump pad 130 is sandwiched by the first metallic pad 114 and the vias 129. Therefore, the active device 112 and the first metallic pads 114 of the first substrate 110 are also electrically connected to the second metallic pads 114 of the second substrate 120 through the bump pads 130. Also shown in FIG. 4, in various embodiments of the present disclosure, the integrated circuit 400 further includes a plurality of bonding pads 140 disposed on the through-silicon vias 126 of the second substrate 120. The bonding pads 140 are respectively electrically connected to the second metallic pads 124 through the through-silicon vias 126. Also as illustrated in FIG. 4, it should be noticed that the semiconductor substrate 122 is positioned above the second metallic pads 114 and the first substrate 110, therefore better mechanical strength can be offered by the semiconductor substrate 122 during the operation of forming the plurality of bonding pads 140. Accordingly, the process stability of the operation of forming the plurality of bonding pads 140 is improved, and furthermore the yield of the integrated circuit 400 would be greater than that of previous integrated circuit 200.

Figure 5:
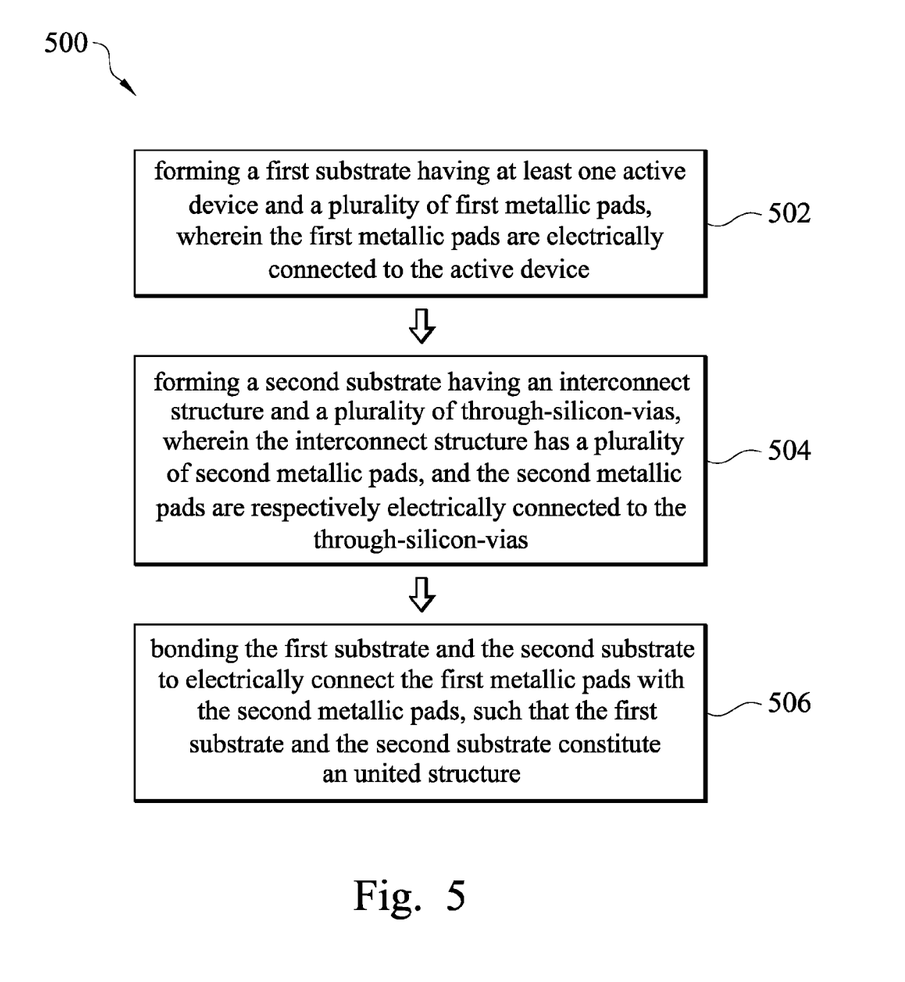
FIG. 5 is a flowchart illustrating a method of fabricating an integrated circuit according to various embodiments of the present disclosure.

FIG. 5 is a flowchart illustrating a method 500 of fabricating an integrated circuit according to various embodiments of the present disclosure. The method 500 begins with block 502 in which a first substrate is formed. The first substrate has at least one active device and a plurality of first metallic pads. The first metallic pads are electrically connected to the active device. The method continues with block 504 in which a second substrate is formed. The second substrate has an interconnect structure and a plurality of through-silicon-vias. The interconnect structure has a plurality of second metallic pads, and the second metallic pads are respectively electrically connected to the through-silicon-vias. It should be noticed that the formation of the first substrate (block 502) and the second substrate (block 504) can be performed in parallel, therefore the cycle time of fabricating the integrated circuit according to various embodiments of the present disclosure can be effectively reduced. Next, the method includes bonding the first substrate and the second substrate to electrically connect the first metallic pads with the second metallic pads, such that the first substrate and the second substrate constitute an united structure as shown in block 506. It should be noticed that the operation of forming the active device and the first metallic pad on the first substrate are performed by front-end-of-line processing without performing back-end-of-line processing, and the operation of forming the second metallic pad on the second substrate is performed by back-end-of-line processing without performing front-end-of-line processing. In other words, front-end-of-line processing layers and back-end-of-line processing layers are respectively fabricated on different substrate. The front-end-of-line processing layers are fabricated on the first substrate while the back-end-of-line processing layers are fabricated on second substrate.

The method for fabricating the integrated circuit according to various embodiments of the present disclosure will now be described in conjunction with FIG. 6-9, and FIG. 2-4.

Figure 6:
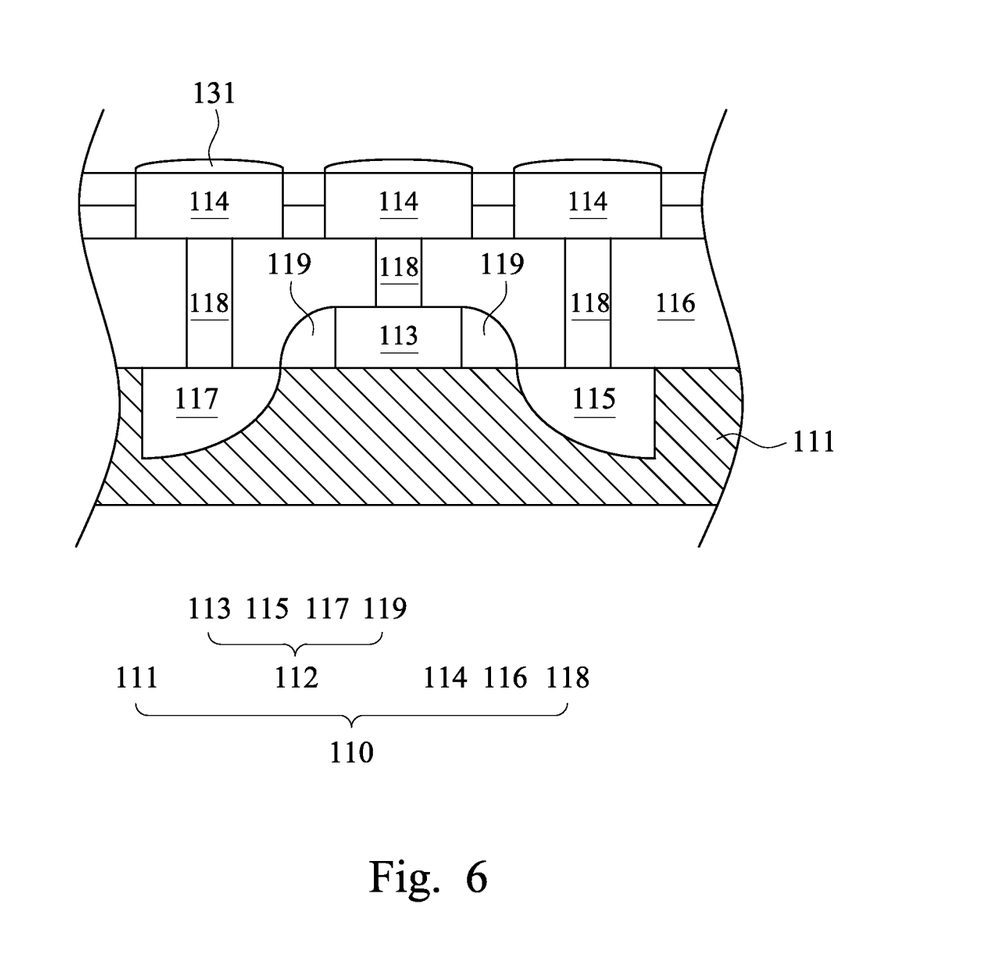
FIG. 6 is a cross-sectional view of a portion of an integrated circuit in an intermediate stage of manufacturing according to various embodiments of the present disclosure.

FIG. 6 is a cross-sectional view of a portion of an integrated circuit in an intermediate stage of manufacturing according to various embodiments of the present disclosure. As illustrated in FIG. 6, a first substrate 110 having at least one active device 112 and a plurality of first metallic pads 114 is formed. The first metallic pads 114 are electrically connected to the active device 112. For example, the substrate 110 may include a semiconductor substrate 111. The active device 112 is formed on the semiconductor substrate 111. The active device 112 may include a gate electrode 113, a source electrode 115, and a drain electrode 117. The active device 112 may further include spacers 119 respectively disposed along two sides of the gate electrode 113. An inter-layer dielectric layer 116 may be formed to cover the active device 112 and the semiconductor substrate 111. The inter-layer dielectric layer 116 may be formed by a suitable process, such as CVD, PVD, ALD, HDPCVD, MOCVD, RPCVD, PECVD, PLD, other suitable techniques, or combinations thereof. A plurality of contacts 118 is formed in the inter-layer dielectric layer 116. The contacts 118 are respectively electrically connected to the gate electrode 113, the source electrode 115, and the drain electrode 117. The first metallic pads 114 are respectively formed on the contacts 118. Therefore, the first metallic pads 114 are respectively electrically connected to the gate electrode 113, the source electrode 115, and the drain electrode 117 of the active device 112. It should be noticed that the operation of forming the forming the first substrate 110 is performed by front-end-of-line processing without performing back-end-of-line processing.

Figure 7:
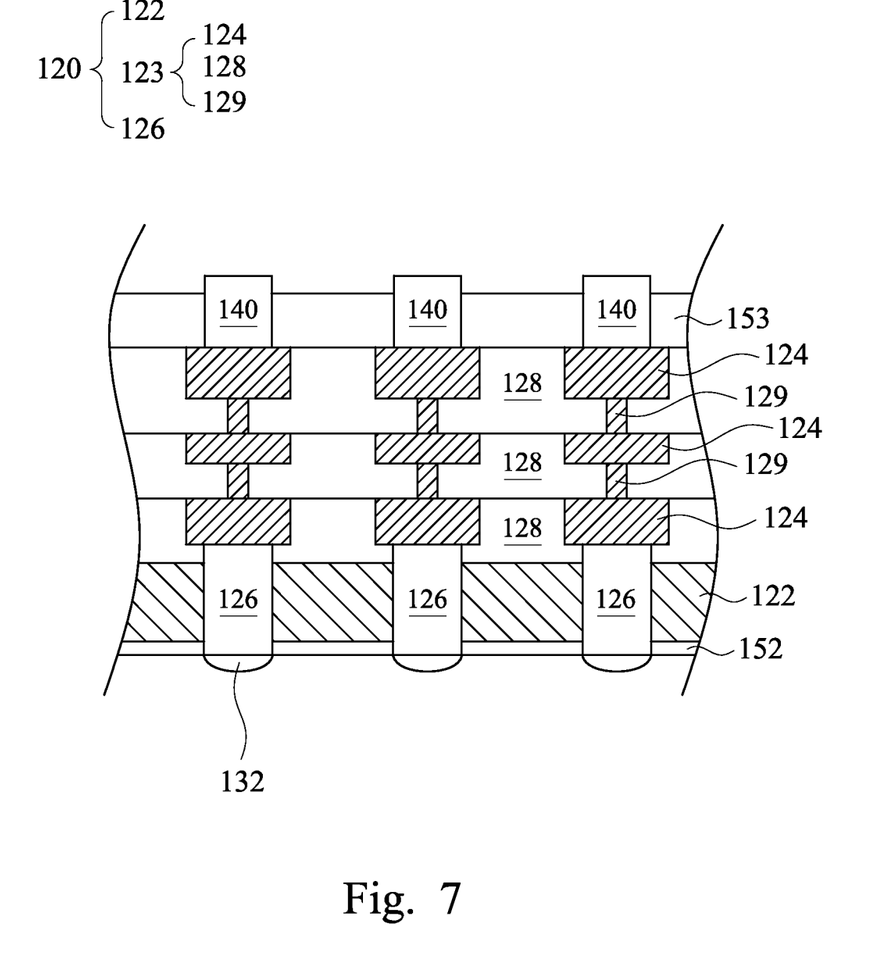
FIG. 7 is a cross-sectional view of a portion of an integrated circuit in an intermediate stage of manufacturing according to various embodiments of the present disclosure.

FIG. 7 is a cross-sectional view of a portion of an integrated circuit in an intermediate stage of manufacturing according to various embodiments of the present disclosure. As illustrated in FIG. 7, a second substrate 120 having an interconnect structure 123 and a plurality of through-silicon-vias 126 is formed. The interconnect structure 123 has a plurality of second metallic pads 124. The second metallic pads 124 are electrically connected to the through-silicon-vias 126. The second substrate 120 may further include a semiconductor substrate 122, and the interconnect structure 123 is disposed on the semiconductor substrate 122. As illustrated in FIG. 7, the interconnect structure 123 may include several layers of metallic layers, inter-metal dielectric layers 128 between different layers of metallic layers, and a plurality of vias 129 disposed in the inter-metal dielectric layers 128. Each metallic layer has a plurality of metallic pads 124, and the vias 129 disposed in the inter-metal dielectric layers 128 electrically connect the second metallic pads 124 on different layers. It should be noticed that the operation of forming the forming the second substrate 110 is performed by back-end-of-line processing without performing front-end-of-line processing.

Referring to FIG. 6 and FIG. 7, FIG. 6 illustrates the first substrate 110; and FIG. 7 illustrates the second substrate 120. After the first substrate 110 and the second substrate 120 are separately formed, the first substrate 110 and the second substrate 120 are bonded to electrically connect the first metallic pads 114 with the second metallic pads 124, such that the first substrate 110 and the second substrate 120 constitute an united structure as illustrated in FIG. 2. In various embodiments of the present disclosure, bonding the first substrate 110 and the second substrate 120 is performed by respectively bonding the through-silicon-vias 126 of the second substrate 120 with the first metallic pads 114 on the first substrate 110. In various embodiments of the present disclosure, before bonding the first substrate and the second substrate, a plurality of first bump pads 131 are formed respectively disposed on the plurality of first metallic pads 114, and/or a plurality of second bump pads 132 are formed respectively disposed on the plurality of through-silicon-vias 126. As illustrated in FIG. 2, the first bump pads 131 are respectively connected to the second bump pads 132, and therefore conductive paths between the first substrate 110 and the second substrate 120 are formed. Also as illustrated in FIG. 7 and FIG. 2, a plurality of bonding pad 140 are formed and electrically connected to the through-silicon-via 126 of the second substrate 120. The bonding pads 140 are electrically connected to the active device 112 of the first substrate 110 through the through-silicon-vias 126, the second metallic pads 124, and the first metallic pads 114.

Figure 8:
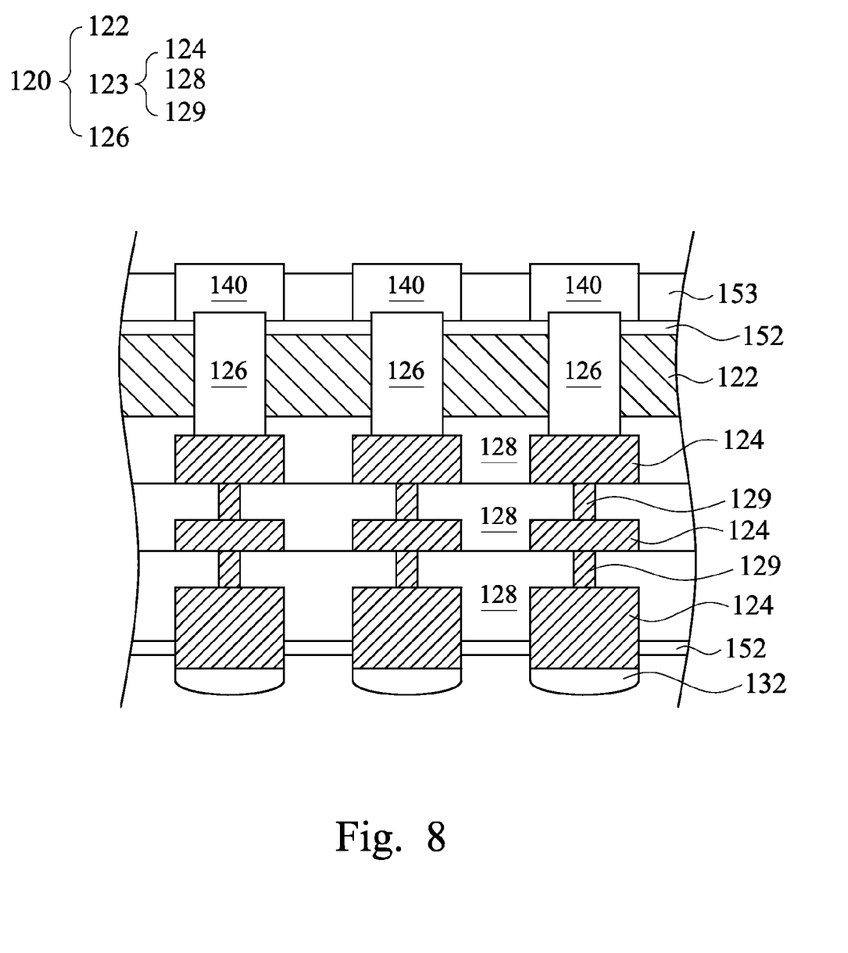
FIG. 8 is a cross-sectional view of a portion of an integrated circuit in an intermediate stage of manufacturing according to various embodiments of the present disclosure.

FIG. 8 is a cross-sectional view of a portion of an integrated circuit in an intermediate stage of manufacturing according to other various embodiments of the present disclosure. As illustrated in FIG. 8, a second substrate 120 having an interconnect structure 123 and a plurality of through-silicon-vias 126 is also formed. The compositions of aforementioned elements are similar to those illustrated in FIG. 7, and therefore the details are omitted here. Referring to FIG. 6 and FIG. 8, FIG. 6 illustrates the first substrate 110; and FIG. 8 illustrates the second substrate 120. After the first substrate 110 and the second substrate 120 are separately formed, the first substrate 110 and the second substrate 120 are bonded to electrically connect the first metallic pads 114 with the second metallic pads 124, such that the first substrate 110 and the second substrate 120 constitute an united structure as illustrated in FIG. 3.

Referring to FIG. 8, FIG. 6, and FIG. 3, in various embodiments of the present disclosure, the operation of bonding the first substrate 110 and the second substrate 120 is performed by bonding the second metallic pads 124 of the second substrate 120 with the first metallic pad 114 of the first substrate 110. In various embodiments of the present disclosure, before the operation of bonding the first substrate 110 and the second substrate 120, a plurality of first bump pads 131 are formed respectively disposed on the plurality of first metallic pads 114, and/or a plurality of second bump pads 132 are formed respectively disposed on the plurality of second metallic pads 124. As illustrated in FIG. 3, the first bump pads 131 are respectively connected to the second bump pads 132, and therefore conductive paths between the first substrate 110 and the second substrate 120 are formed. Also as illustrated in FIG. 8 and FIG. 3, a plurality of bonding pad 140 are formed on the plurality of through-silicon-vias 126 of the second substrate 120, and the bonding pads 140 are respectively electrically connected to the through-silicon-vias 126. The bonding pads 140 are electrically connected to the active device 112 of the first substrate 110 through the through-silicon-vias 126, the second metallic pads 124, and the first metallic pads 114. It should be noticed that the semiconductor substrate 122 is positioned above the second metallic pads 114 and the first substrate 110, therefore better mechanical strength can be offered by the semiconductor substrate 122 during the operation of forming the plurality of bonding pads 140. Accordingly, the process stability of the operation of forming the plurality of bonding pads 140 is improved, and furthermore the yield of the integrated circuit 300 would be greater than that of previous integrated circuit 200.

Figure 9:
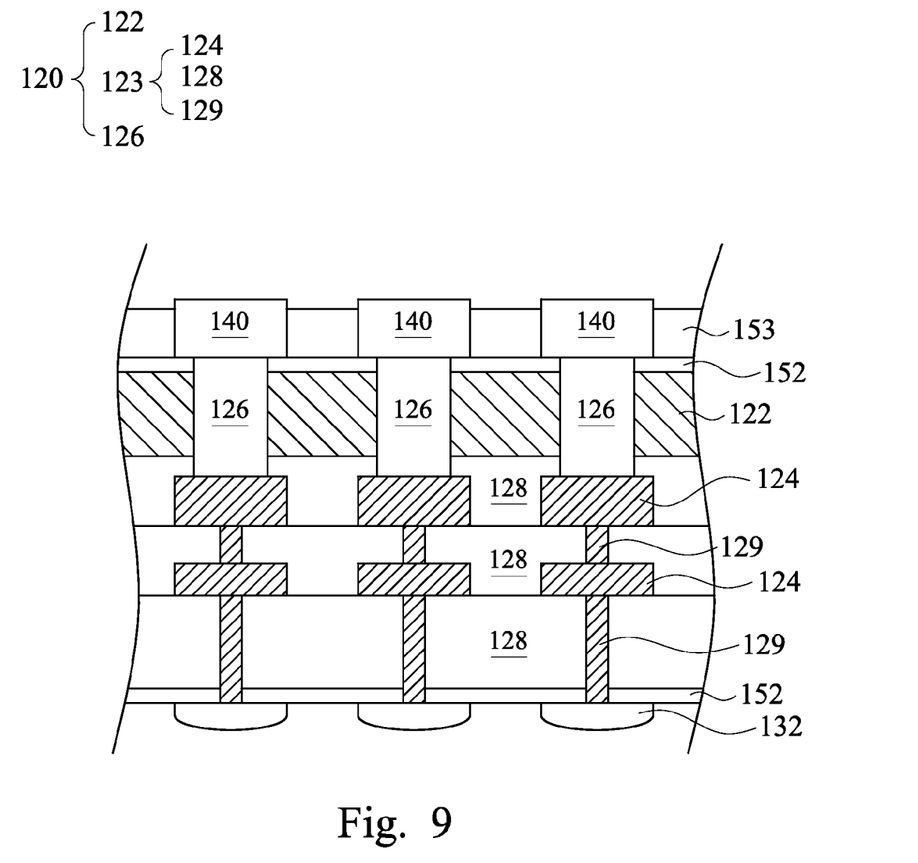
FIG. 9 is a cross-sectional view of a portion of an integrated circuit in an intermediate stage of manufacturing according to various embodiments of the present disclosure.

FIG. 9 is a cross-sectional view of a portion of an integrated circuit in an intermediate stage of manufacturing according to various embodiments of the present disclosure. As illustrated in FIG. 9, a second substrate 120 having an interconnect structure 123 and a plurality of through-silicon-vias 126 is also formed. The compositions of above elements are similar to those illustrated in FIG. 8, and therefore the details are omitted here. Referring to FIG. 6 and FIG. 9, FIG. 6 illustrates the first substrate 110; and FIG. 9 illustrates the second substrate 120. After the first substrate 110 and the second substrate 120 are separately formed, the first substrate 110 and the second substrate 120 are bonded to electrically connect the first metallic pads 114 with the second metallic pads 124, such that the first substrate 110 and the second substrate 120 constitute an united structure as illustrated in FIG. 3.

Referring to FIG. 9, FIG. 6, and FIG. 4, in various embodiments of the present disclosure, the operation of bonding the first substrate 110 and the second substrate 120 is performed by bonding the second metallic pads 124 of the second substrate 120 with the first metallic pad 114 of the first substrate 110. Before bonding the first substrate 110 and the second substrate 120, the method further includes forming an inter-metal dielectric layer 129 covering the second metallic pads 114 on the second substrate 120. And forming a plurality of vias in the inter-metal dielectric layer 129. The vias 129 are respectively electrically connected to the second metallic pads 124 of the second substrate 120. As shown in FIG. 4, it should be noticed that the operation of bonding the first substrate 110 and the second substrate 120 is performed by respectively bonding the vias 129 of the second substrate 120 with the first metallic pads 114 of the first substrate 110. In various embodiments of the present disclosure, before the operation of bonding the first substrate 110 and the second substrate 120, a plurality of first bump pads 131 are formed disposed on the plurality of first metallic pads 114, and/or a plurality of second bump pads 132 are formed disposed on the plurality of vias 129. As illustrated in FIG. 4, the first bump pads 131 are respectively connected to the second bump pads 132, and therefore conductive paths between the first substrate 110 and the second substrate 120 are formed. Also as illustrated in FIG. 9 and FIG. 4, a plurality of bonding pad 140 are formed on the plurality of through-silicon-vias 126 of the second substrate 120, and the bonding pads 140 are respectively electrically connected to the through-silicon-vias 126. The bonding pads 140 are electrically connected to the active device 112 of the first substrate 110 through the through-silicon-vias 126, the second metallic pads 124, and the first metallic pads 114. It should be noticed that the semiconductor substrate 122 is positioned above the second metallic pads 114 and the first substrate 110, therefore better mechanical strength can be offered by the semiconductor substrate 122 during the operation of forming the plurality of bonding pads 140. Accordingly, the process stability of the operation of forming the plurality of bonding pads 140 is improved, and furthermore the yield of the integrated circuit 400 would be greater than that of previous integrated circuit 200.

As aforementioned, Conventional fabrication of back-end-of-line processing layers is performed after that of front-end-of-line process layers, thus a bottom-up sequence of processes is performed on one semiconductor substrate to fabricate the multi-layer interconnect structure of the integrated circuit. According to various embodiments of the present disclosure, fabrication of back-end-of-line processing layers and that of front-end-of-line process layers are performed in parallel. Therefore, the fabrication of back-end-of-line processing layers is not necessary to wait for completion of the fabrication of front-end-of-line processing layers. Accordingly, the cycle time of fabricating the integrated circuit can be dramatically reduced. In addition, since the fabrication of back-end-of-line processing layers and that of front-end-of-line process layers are performed in parallel, particles contamination and/or process defects may occur within each layer of back-end-of-line processing layers and front-end-of-line process layers can be handled separately, and lower the risk of lower yields of manufacturing the integrated circuit within a semiconductor wafer.

In some embodiments, the present disclosure relates to an integrated circuit. The integrated circuit includes a first substrate, a second substrate, and a plurality of bump pads. The first substrate has at least one active device and a plurality of first metallic pads electrically connected to the active device, wherein the first substrate has front-end-of-line processing layers without back-end-of-line processing layers over the front-end-of-line processing layers. The second substrate has a semiconductor substrate and an interconnect structure disposed on the semiconductor substrate, and the interconnect structure has a plurality of second metallic pads, wherein the second substrate does not include any active devices. The plurality of bump pads is sandwiched by the first substrate and the second substrate, wherein the active device and the first metallic pads of the first substrate are electrically connected to the second metallic pads of the second substrate through the bump pads.

In other embodiments, the present disclosure relates to an integrated circuit. The integrated circuit includes a first substrate, a second substrate, and a plurality of bump pads. The first substrate has at least one active device and a plurality of first metallic pads electrically connected to the active device, wherein the first substrate has front-end-of-line processing layers without back-end-of-line processing layers over the front-end-of-line processing layers. The second substrate has a semiconductor substrate, a plurality of through-silicon vias disposed in the semiconductor substrate, and an interconnect structure disposed on the semiconductor substrate, the interconnect structure has a plurality of second metallic pads, wherein the second substrate does not include any active devices. The plurality of bump pads is sandwiched by the first substrate and the second substrate, wherein the active device and the first metallic pads of the first substrate are electrically connected to the second metallic pads of the second substrate through the bump pads, and the through-silicon vias are respectively electrically connected to the second metallic pads.

In other embodiments, the present disclosure relates to a method of fabricating an integrated circuit. The method includes forming a first substrate having at least one active device and a plurality of first metallic pads, wherein the first metallic pads are electrically connected to the active device. The method further includes forming a second substrate having an interconnect structure and a plurality of through-silicon-vias, wherein the interconnect structure has a plurality of second metallic pads, and the second metallic pads are respectively electrically connected to the through-silicon-vias. The method further includes bonding the first substrate and the second substrate to electrically connect the first metallic pads with the second metallic pads, such that the first substrate and the second substrate constitute an united structure, wherein the operation of forming the first substrate is performed by front-end-of-line processing without performing back-end-of-line processing, and the operation of forming the second substrate is performed by back-end-of-line processing without performing front-end-of-line processing.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
a first substrate having at least one active device and a plurality of first metallic pads electrically connected to the active device, wherein the first substrate has front-end-of-line processing layers without back-end-of-line processing layers over the front-end-of-line processing layers;
a second substrate having a semiconductor substrate and an interconnect structure disposed on the semiconductor substrate, and the interconnect structure has a plurality of second metallic pads, wherein the second substrate does not include any active devices; and
a plurality of bump pads sandwiched by the first substrate and the second substrate,
wherein the active device and the first metallic pads of the first substrate are electrically connected to the second metallic pads of the second substrate through the bump pads.

2. The integrated circuit of claim 1, wherein the second substrate further comprises a plurality of through-silicon vias disposed in the semiconductor substrate, and the through-silicon vias are respectively electrically connected to the second metallic pads.

3. The integrated circuit of claim 2, wherein the semiconductor substrate is disposed between the bump pads and the second metallic pads, and the second metallic pads are respectively electrically connected to the bump pads through the through-silicon vias.

4. The integrated circuit of claim 3, wherein the bump pads are respectively sandwiched by the first metallic pads and the through-silicon vias.

5. The integrated circuit of claim 4, wherein the bump pad further comprises:
   a first bump disposed on the first metallic pad; and
   a second bump pad disposed below the through-silicon via of the second substrate.

6. The integrated circuit of claim 3, further comprising:
   a plurality of bonding pads disposed on the plurality of second metallic pads of the second substrate, wherein the bonding pads are respectively electrically connected to the second metallic pads.

7. The integrated circuit of claim 1, wherein the interconnect structure further comprises:
   an inter-metal layer covering the second metallic pads; and
   a plurality of via disposed in the inter-metal layer, wherein the vias are respectively electrically connected to the second metallic pads.

8. The integrated circuit of claim 1, wherein the active device comprises a gate electrode, a source electrode and a drain electrode, and the gate electrode being interposed between the source electrode and the drain electrode.

9. The integrated circuit of claim 8, wherein the active device further comprises spacers respectively disposed along two sides of the gate electrode.

10. The integrated circuit of claim 8, wherein the first substrate further comprises:
    an inter-layer dielectric disposed between the active device and the plurality of first metallic pads; and
    a plurality of contacts disposed in the inter-layer dielectric, wherein the contacts are respectively electrically connected to the gate electrode, the source electrode, and the drain electrode of the active device.

11. An integrated circuit, comprising:
    a first substrate having at least one active device and a plurality of first metallic pads electrically connected to the active device, wherein the first substrate has front-end-of-line processing layers without back-end-of-line processing layers over the front-end-of-line processing layers;
    a second substrate having a semiconductor substrate, a plurality of through-silicon vias disposed in the semiconductor substrate, and an interconnect structure disposed on the semiconductor substrate, the interconnect structure has a plurality of second metallic pads, wherein the second substrate does not include any active devices; and
    a plurality of bump pads sandwiched by the first substrate and the second substrate,
    wherein the active device and the first metallic pads of the first substrate are electrically connected to the second metallic pads of the second substrate through the bump pads, and the through-silicon vias are respectively electrically connected to the second metallic pads.

12. The integrated circuit of claim 11, wherein the semiconductor substrate is disposed between the bump pads and the second metallic pads.

13. The integrated circuit of claim 12, wherein the through-silicon vias are respectively in contact with the bump pad and the second metallic pad.

14. The integrated circuit of claim 13, wherein the bump pads are respectively in contact with the first metallic pads.

15. The integrated circuit of claim 14, wherein the bump pad further comprises:
    a first bump in contact with the first metallic pad; and
    a second bump pad in contact with the through-silicon via of the second substrate.

16. The integrated circuit of claim 11, further comprising:
    a plurality of bonding pads disposed on the plurality of second metallic pads of the second substrate, wherein the bonding pads are respectively electrically connected to the second metallic pads.

17. The integrated circuit of claim 11, further comprising a first passivation layer disposed between the first substrate and the second substrate.

18. The integrated circuit of claim 17, further comprising a second passivation layer covering the plurality of second metallic pads of the second substrate, and the first passivation layer and the second passivation layer are located on opposite surfaces of the second substrate.

19. The integrated circuit of claim 11, wherein the active device comprises a gate electrode, a source electrode and a drain electrode, and the gate electrode being interposed between the source electrode and the drain electrode.

20. The integrated circuit of claim 11, wherein the first substrate further comprises:
    an inter-layer dielectric disposed between the active device and the plurality of first metallic pads; and
    a plurality of contacts disposed in the inter-layer dielectric, wherein the contacts are respectively electrically connected to the gate electrode, the source electrode, and the drain electrode of the active device.

\* \* \* \* \*